(12) United States Patent
Jun

(10) Patent No.: US 7,776,513 B2
(45) Date of Patent: Aug. 17, 2010

(54) METHOD OF MANUFACTURING SEMICONDUCTOR DEVICE

(75) Inventor: Sung-Ho Jun, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 426 days.

(21) Appl. No.: 11/847,069

(22) Filed: Aug. 29, 2007

(65) Prior Publication Data
US 2008/0057441 A1    Mar. 6, 2008

(30) Foreign Application Priority Data
Sep. 4, 2006    (KR)    ............ 10-2006-0084540

(51) Int. Cl.
*G03F 7/00* (2006.01)
(52) U.S. Cl. ............ 430/302; 430/322; 430/330
(58) Field of Classification Search ........ 430/302, 430/322, 330
See application file for complete search history.

(56) References Cited

U.S. PATENT DOCUMENTS

| | | | | |
|---|---|---|---|---|
| 6,555,607 B1 * | 4/2003 | Kanda et al. | ............ | 524/366 |
| 2007/0053033 A1 * | 3/2007 | Shiozawa | ............ | 359/15 |

* cited by examiner

*Primary Examiner*—Thorl Chea
(74) *Attorney, Agent, or Firm*—Sherr & Vaughn, PLLC

(57) ABSTRACT

A method for manufacturing a semiconductor device including coating a photo-resist layer on a semiconductor substrate having a lower layer; performing a soft-bake process on the photo-resist layer; performing an exposure process on the photo-resist layer having passed through the soft-bake process; performing a post exposure-bake (PEB) process on photo-resist pattern holes formed by the exposure process; performing a developing process on the photo-resist pattern holes having passed through the PEB process; and performing a hard-bake process on the photo-resist pattern holes having passed through the developing process. The method improves the circularity of PR pattern holes to improve the profile of contacts in an etching process after a photography process, resulting in an enhancement in the operation reliability of the device.

16 Claims, 13 Drawing Sheets

Average = 3.8nm

Average = 2.8nm

METHOD OF MANUFACTURING SEMICONDUCTOR DEVICE

The present application claims priority under 35 U.S.C. 119 Korean Patent Application No. 10-2006-0084540 (filed on Sep. 4, 2006), which is hereby incorporated by reference in its entirety.

BACKGROUND

Semiconductor devices can be manufactured by selectively and repeatedly performing various processes on a wafer, such as photography, etching, chemical vapor deposition, ion injection, and metal deposition processes. A photography process for forming a desired integrated circuit pattern on a wafer using a photo-mask is a key technique in the field of semiconductor fabrication.

With a gradual increase in the integration degree of a semiconductor device, there is a need for enhancing the resolution power to a range of approximately one-half wavelength or less during a photolithographic process of a micro-pattern processing technique. Accordingly, it can be important to optimize a photographic process for increasing a process margin. In the case of a 130 nm device, a critical dimension (CD) of contact holes can be approximately 160 nm. On the other hand, in the case of a 90 nm logic device, the CD of contact holes can be approximately 115 nm. Since such CD values exceed the resolution limit of a krypton fluoride (KrF) optical source, an argon fluoride (ArF) optical source may be used. This may result in a change in a photo-resist (PR) material. The ArF optical source has a short wavelength of approximately 193 nm, and must use a PR having a low physical etching resistance chemical structure. This is due to the fact that a PR for the KrF optical source, having a benzene ring-shaped chemical structure, has light-absorption characteristics.

Figure 1A:
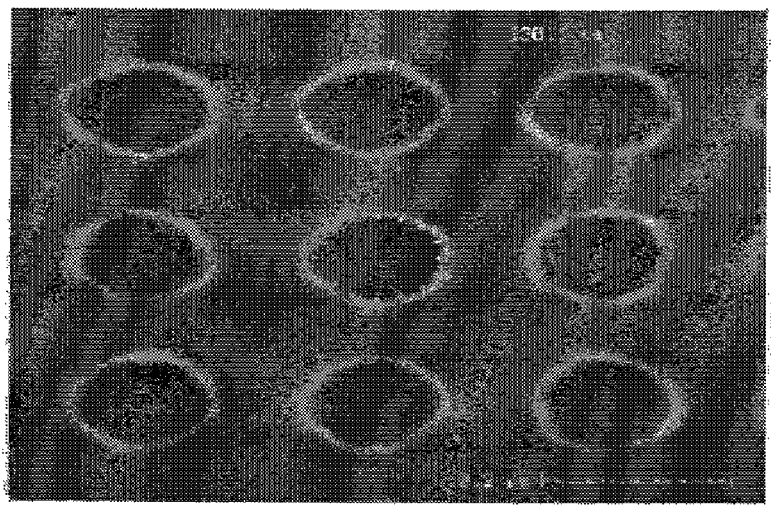

Example FIG. 1A illustrates PR pattern holes after a photographic process used to form contact holes for the connection of a first metal wiring in a 90 nm device. Example FIG. 1B illustrates contact holes after an etching process for etching a lower layer using a PR pattern formed via a photographic process.

Figure 1B:
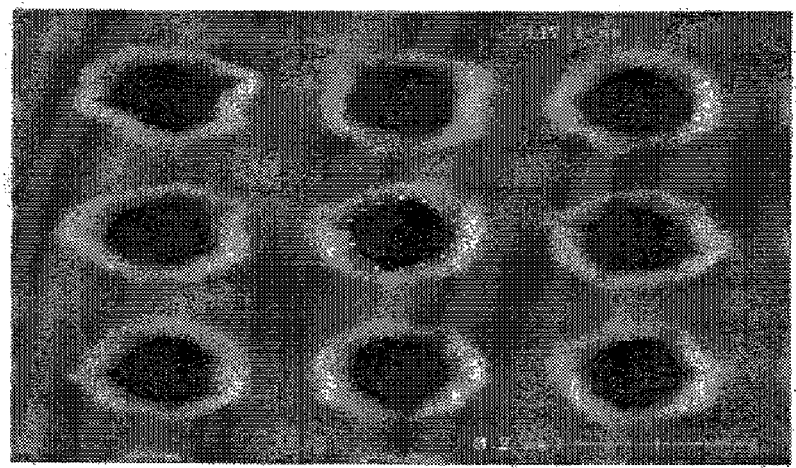

In relation to the resolution problem of the PR pattern due to a gradual reduction in the CD of contact holes, the contact holes illustrated in example FIG. 1B have a substantially abnormal shape. Contact holes having such an abnormal shape are undesirable. The abnormal shape of contact holes deteriorates the uniformity of a CD, causing a "bridge phenomenon." When contact holes for connecting a first metal wiring of multilayer metal wirings are inaccurately etched, it may become difficult for the contact holes to reach an active region to be contacted. This may result in unstable contact resistance and low productivity. The CD of contact holes shows a great variation, and may deteriorate the operational rate of a semiconductor device requiring high-frequency operation. Particularly, the spacing between contact holes are effecting in that neighboring contact holes may be unintentionally connected to each other. This may result in a poor process margin. It may also become difficult to achieve a desired CD of an uppermost layer of a semiconductor device after etching. A PR pattern sidewall may also have an irregular etching rate, and consequently, have a different etching bias variation from that of substantially circular holes. Due to a different shape from the more accurately circular holes, a large-seam problem may develop upon deposition of tungsten (W). For instance, a void in the center of a contact hole increases up to approximately 50 nm or more, thereby making it impossible to normally fill the contact hole and aggravating a "floating phenomenon" whereby the contact hole may not reach a target point. The abnormal shape of contact holes may deteriorate the strength of an overlay that includes a plurality of metal wiring layers. It may be important to prevent an increase in contact resistance due to the misalignment of the overlay of the plurality of metal wiring layers. Otherwise, the increased contact resistance results in a change in source resistance, and consequently, a change in threshold voltage. This disadvantageously may cause an "electric short-circuit phenomenon."

SUMMARY

Embodiments relate to a method for manufacturing a semiconductor device including at least one of the following steps: forming a photo-resist layer on and/or over a semiconductor substrate having a lower layer; performing a soft-bake process on the photo-resist layer; performing an exposure process on the photo-resist layer; performing a post exposure-bake (PEB) process on photo-resist pattern holes formed during the exposure process; performing a development process on the photo-resist pattern holes; and performing a hard-bake process on the photo-resist pattern holes.

DRAWINGS

Example FIGS. 1A and 1B illustrate the shape of contact holes after a photographic process and an etching process.

Figure 2:
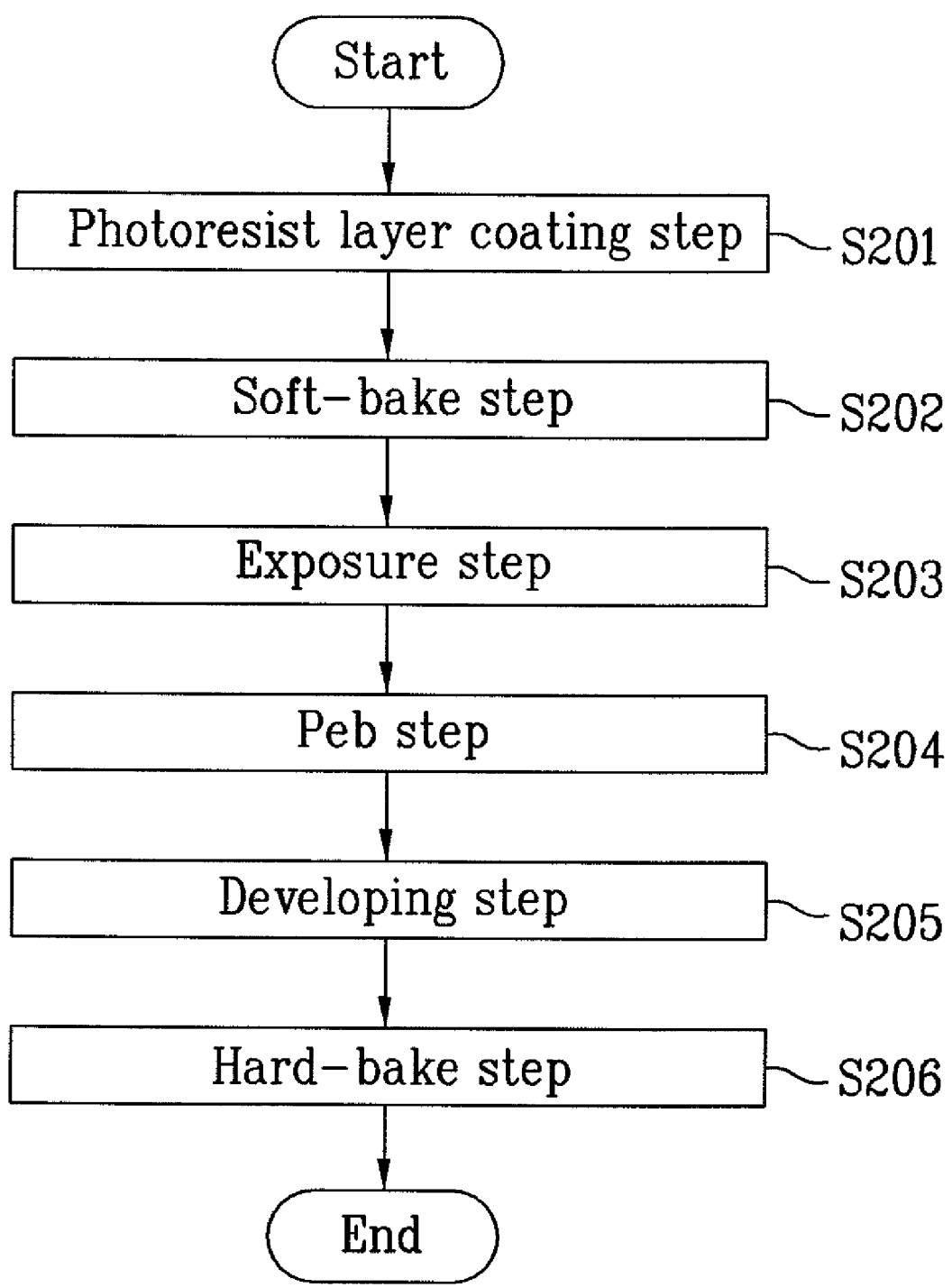

Example FIG. 2 illustrates a flow chart of a method for manufacturing a semiconductor device, in accordance with embodiments.

Figure 3:
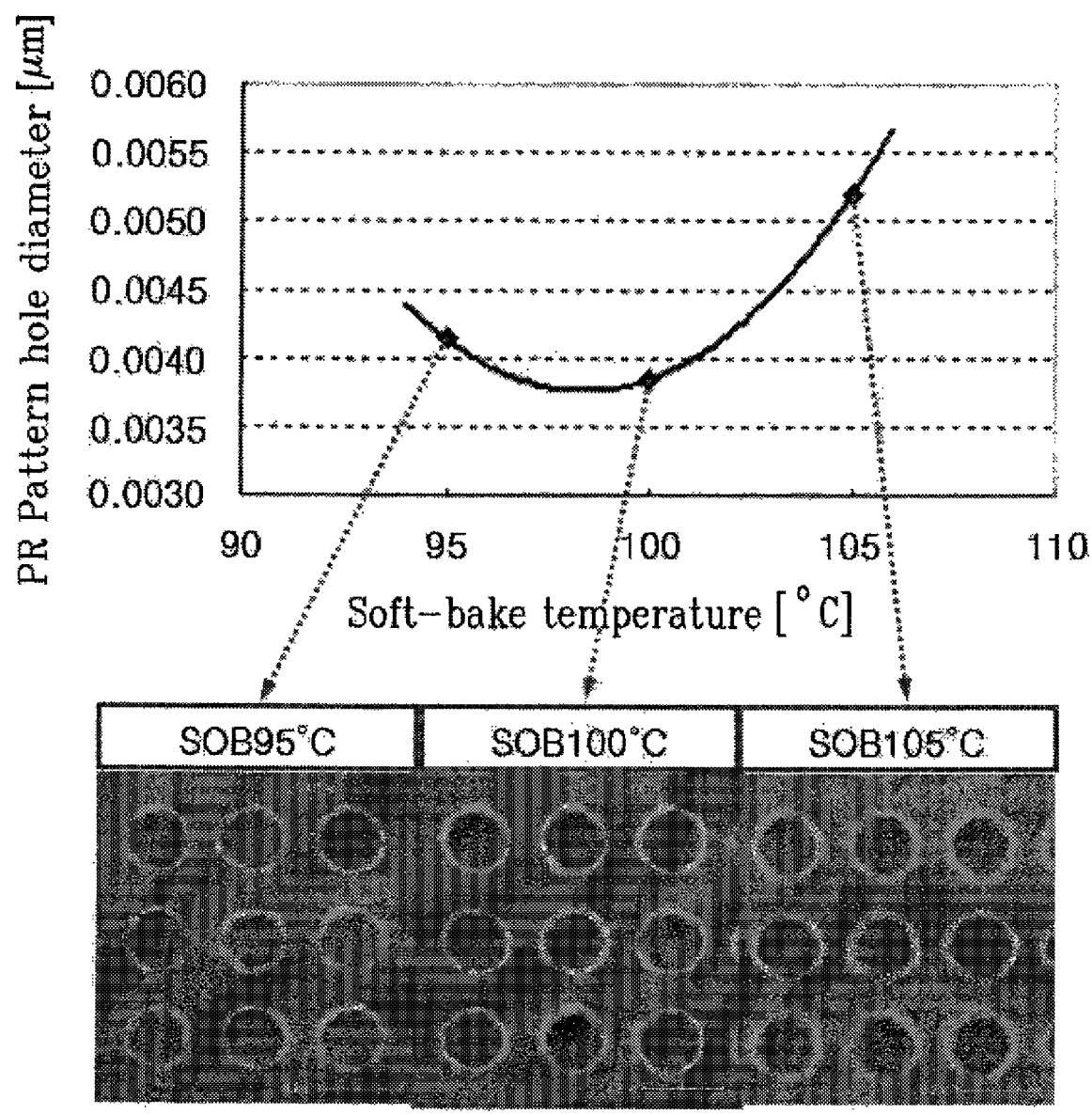

Example FIG. 3 illustrates a plurality of photo-resist pattern holes and the relationship between soft-bake temperature and photo-resist pattern hole diameter.

Figure 4A:
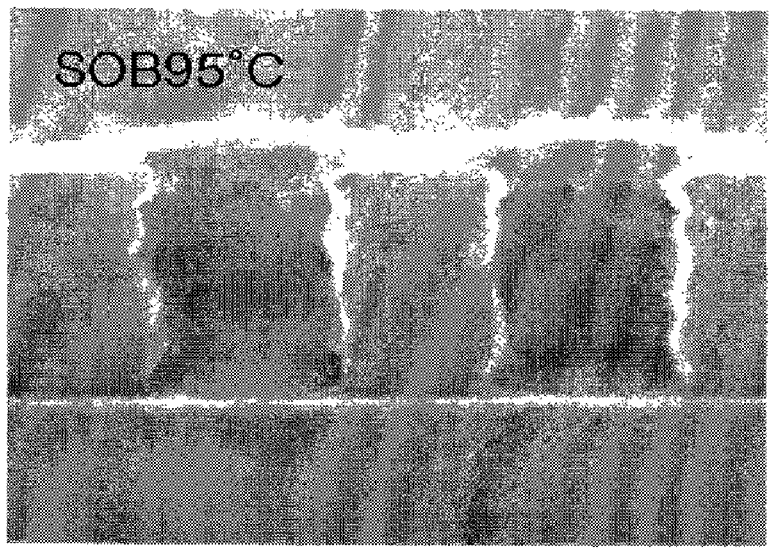
Figure 4B:
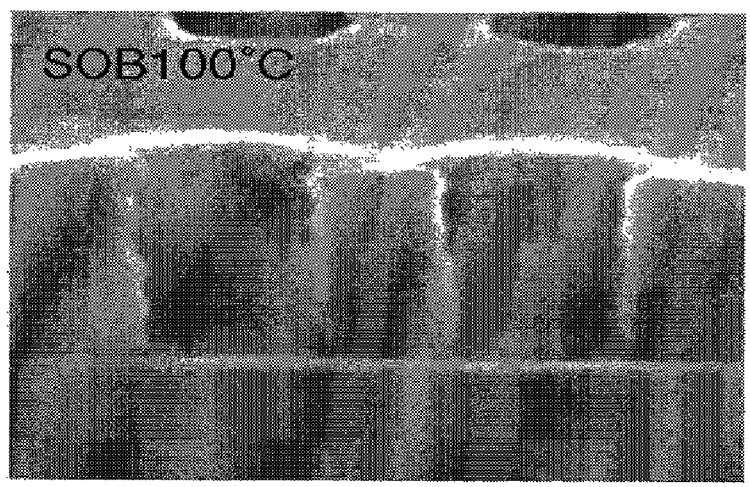
Figure 4C:
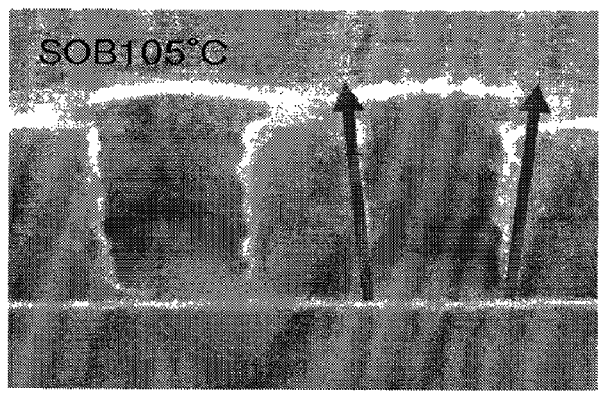

Example FIGS. 4A to 4C illustrate a plurality of photo-resist pattern holes, in accordance with embodiments.

Figure 5:
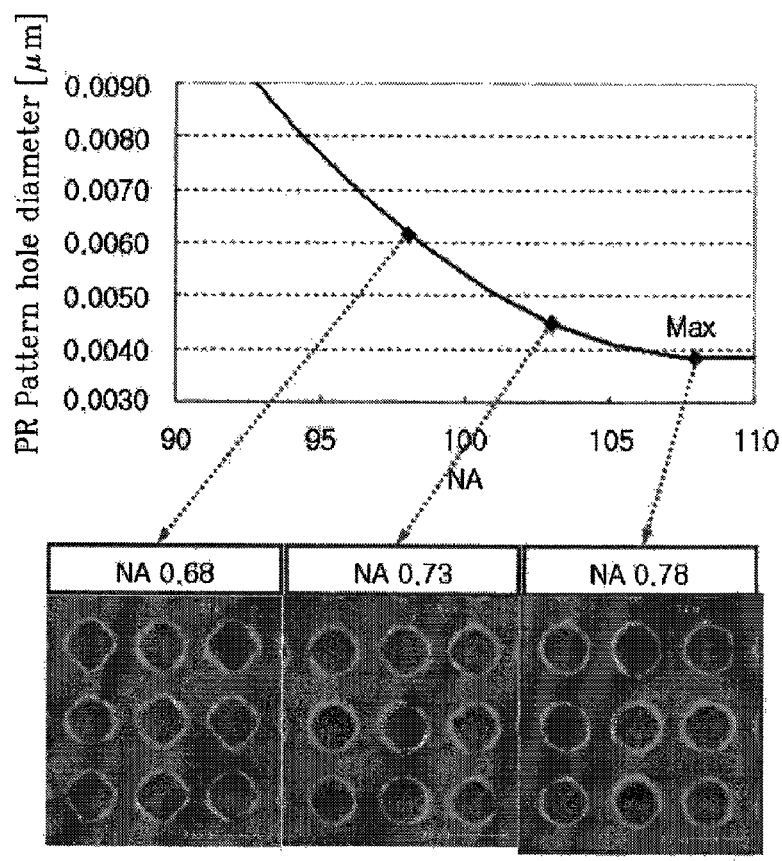

Example FIG. 5 illustrates a plurality of photo-resist pattern holes and the relationship between NA and photo-resist pattern hole diameter.

Figure 6:
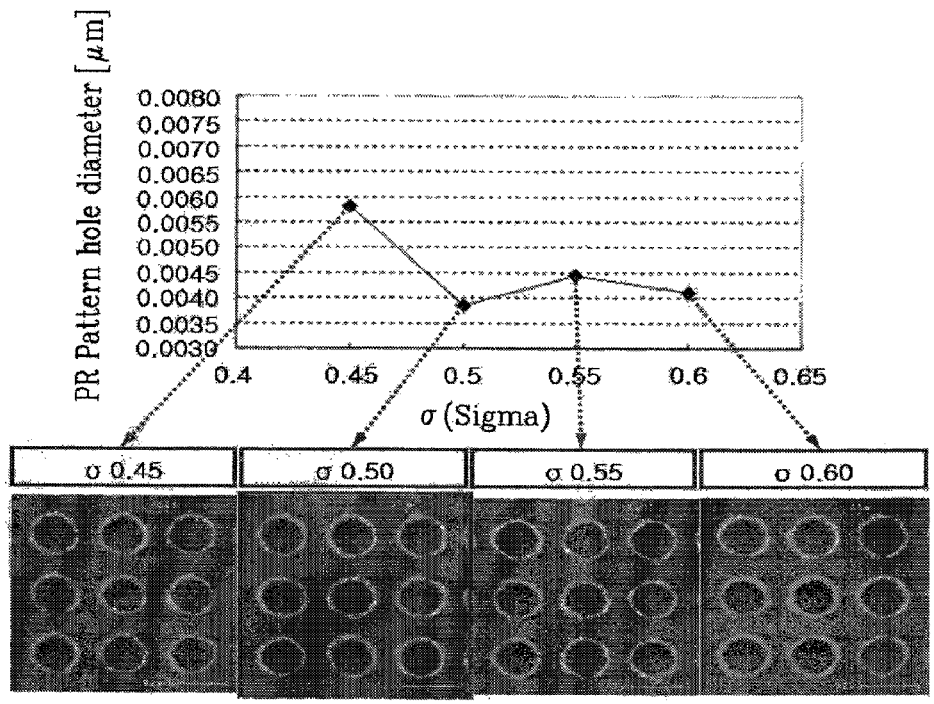

Example FIG. 6 illustrates a plurality of photo-resist pattern holes and the relationship between σ and photo-resist pattern hole diameter.

Figure 7:
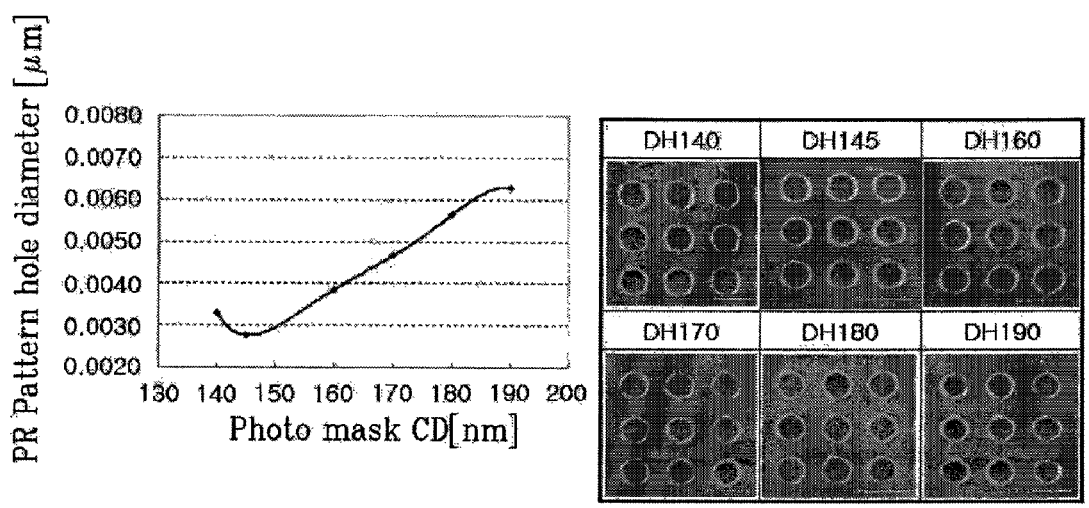

Example FIG. 7 illustrates a plurality of photo-resist pattern holes and the relationship between photo-mask CD and photo-resist pattern hole diameter.

Figure 8A:
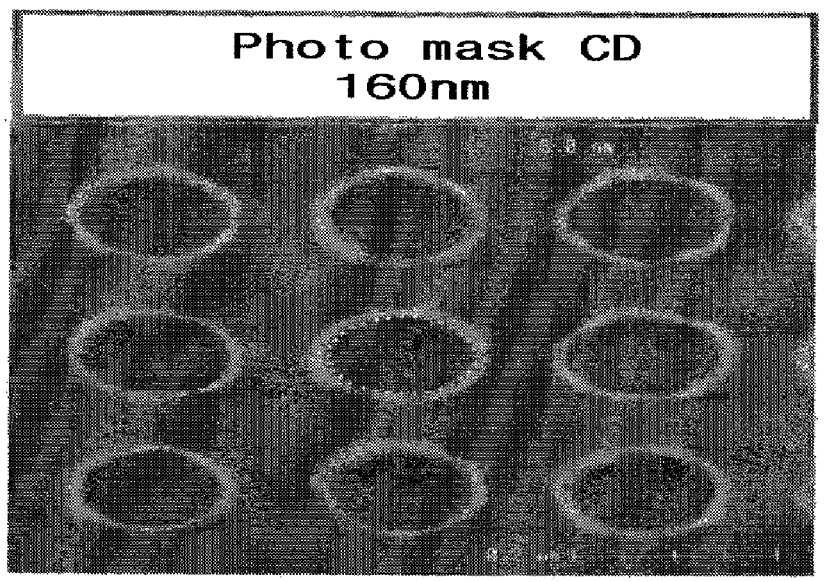
Figure 8B:
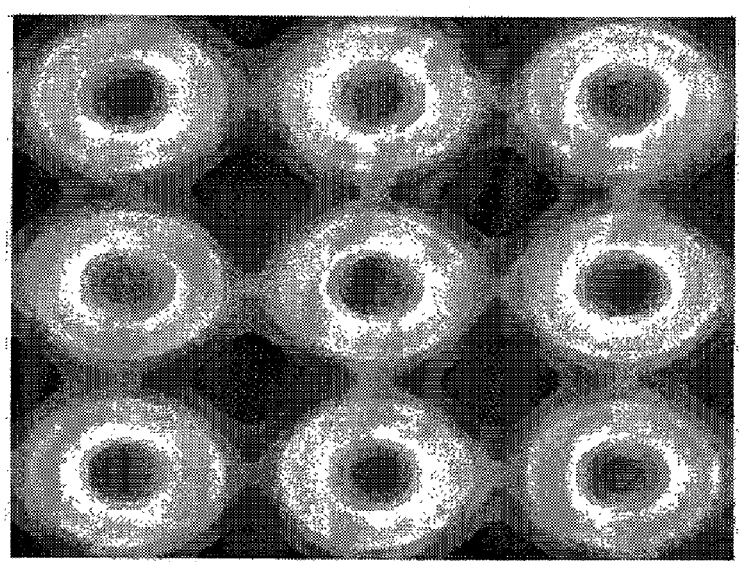

Example FIGS. 8A and 8B illustrate the average diameter of photo-resist pattern holes when photo-mask CD is 160 nm.

Figure 8C:
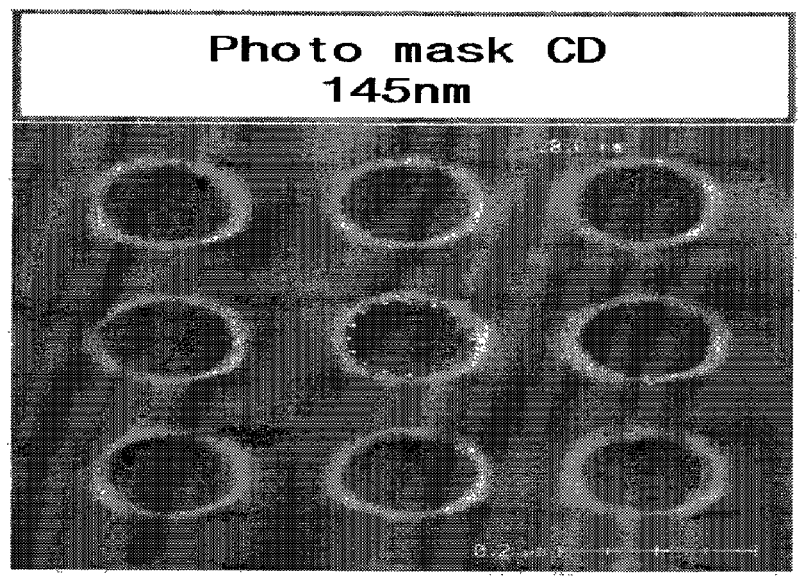
Figure 8D:
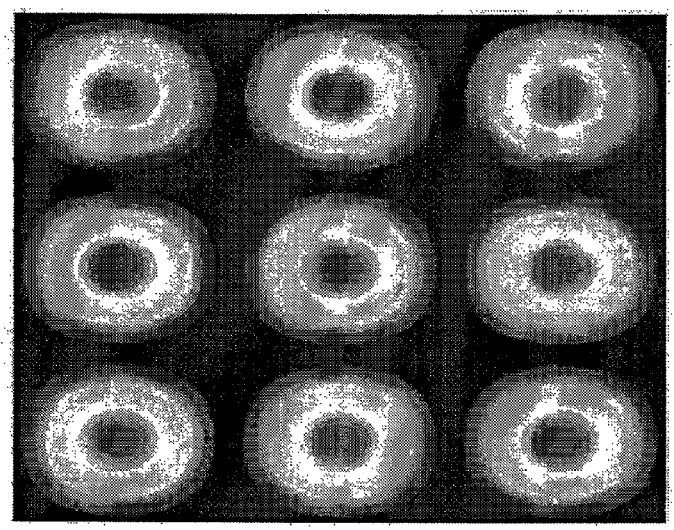

Example FIGS. 8C and 8D illustrate the average diameter of photo-resist pattern holes when photo-mask CD is 145 nm.

Figure 9:
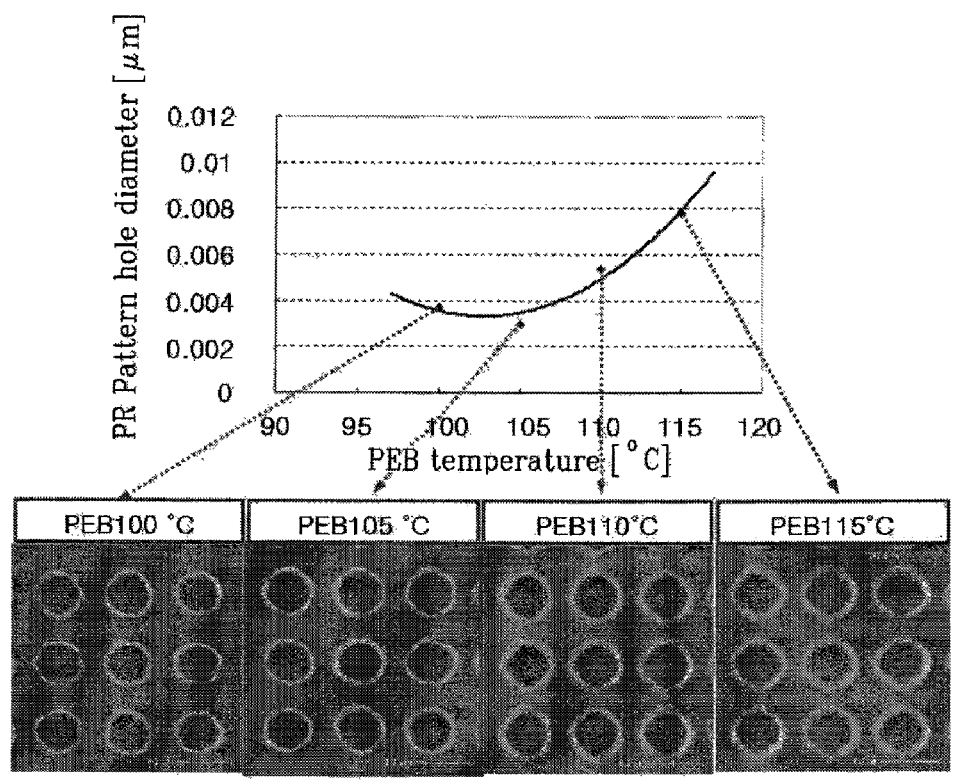

Example FIG. 9 illustrates a plurality of photo-resist pattern holes and the relationship between PEB process temperature and photo-resist pattern hole diameter.

Figure 10A:
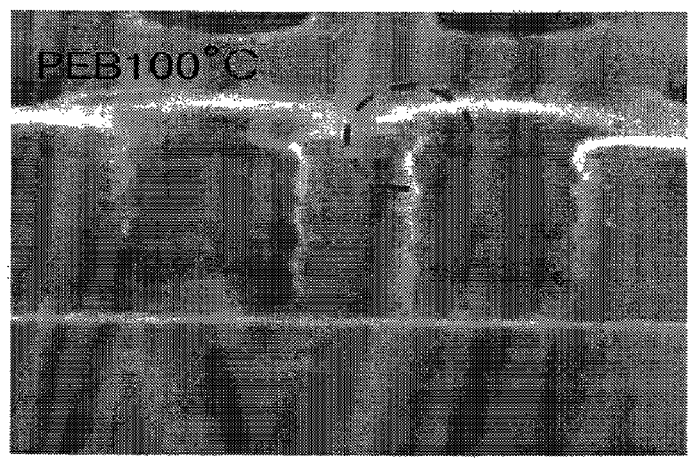
Figure 10B:
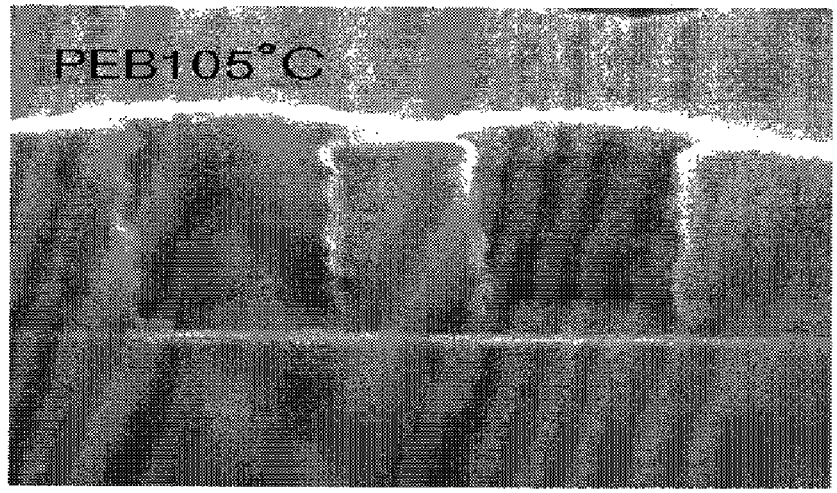
Figure 10C:
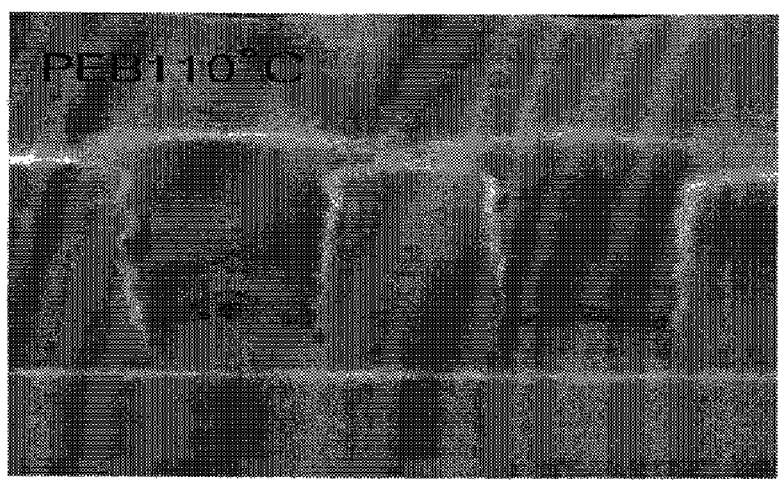

Example FIGS. 10A to 10C illustrate photo-resist pattern holes, in accordance with embodiments.

Figure 11:
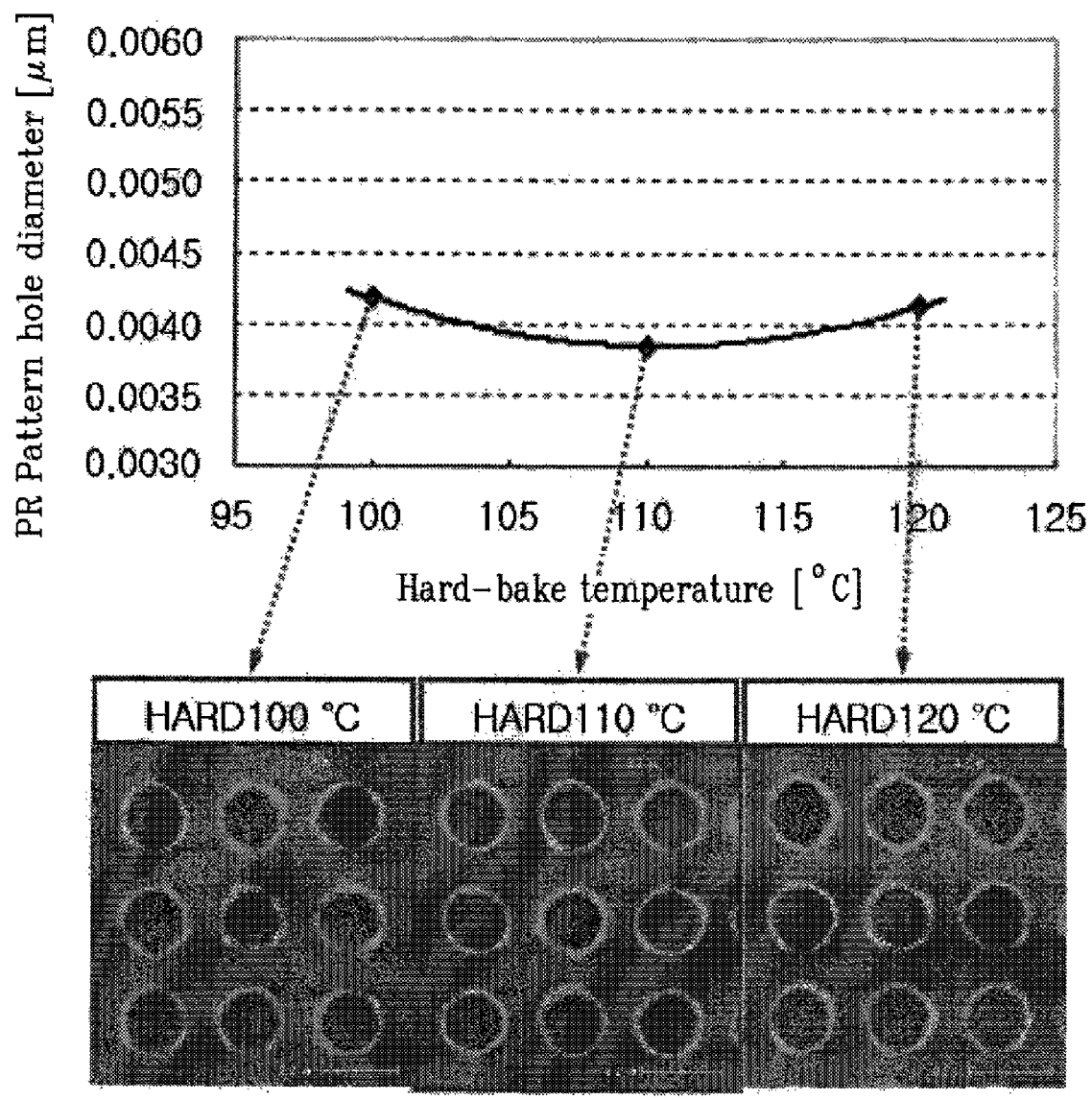

Example FIG. 11 illustrates a plurality of photo-resist pattern holes and the relationship between hard-bake temperature and photo-resist pattern hole diameter.

Figure 12A:
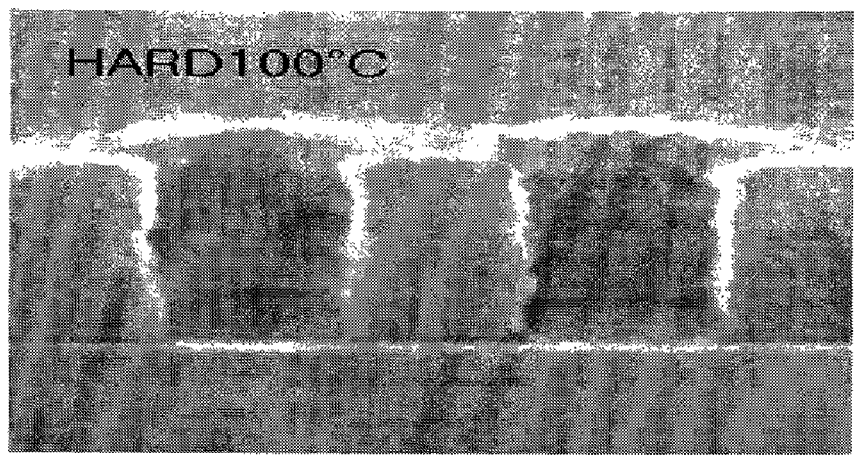
Figure 12B:
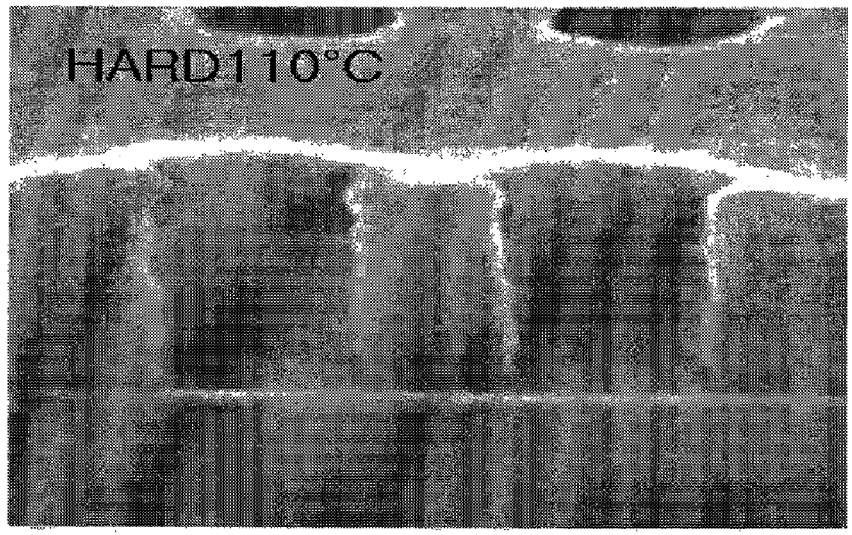
Figure 12C:
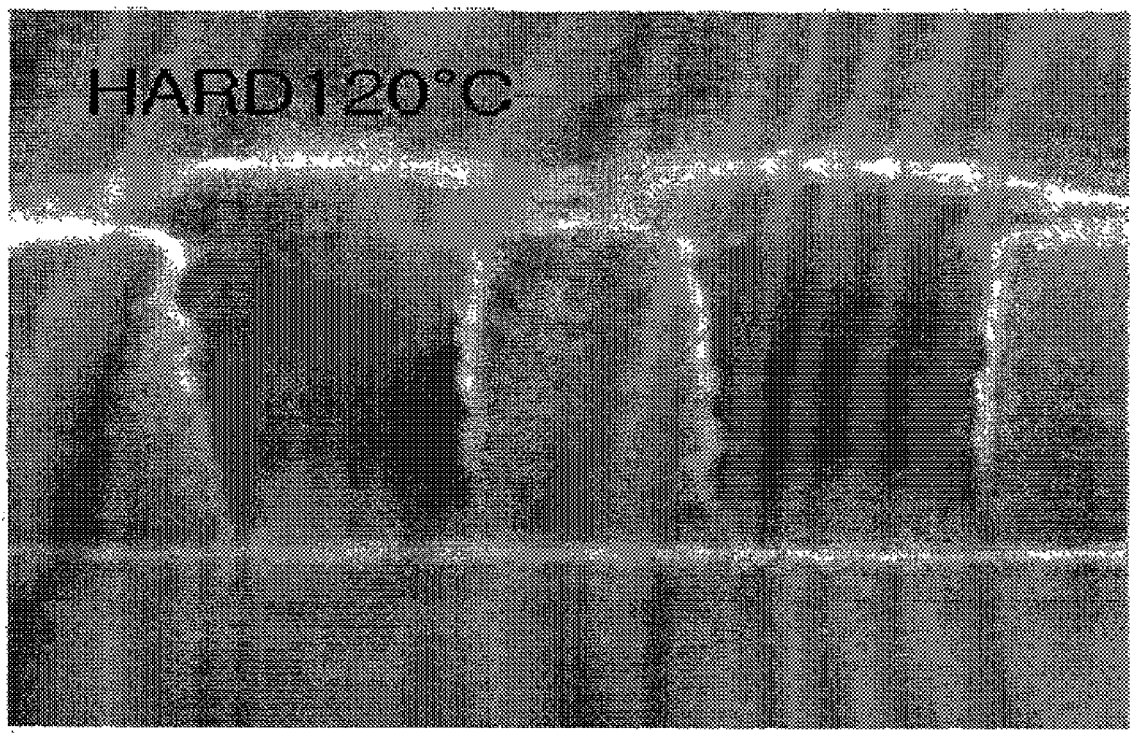

Example FIGS. 12A to 12C illustrate photo-resist pattern holes in accordance with embodiments.

DESCRIPTION

As illustrated in example FIG. 2, in step 201 (S201), a photo-resist layer is coated on and/or over a semiconductor substrate having a lower layer on which a micro-pattern such as an insulation layer and a conductive layer may be formed.

In step 202 (S202), a soft-bake process may be performed on the coated photo-resist layer at a temperature range of between approximately 98 degrees C. to 102 degrees C. The soft-bake process serves to change a liquid-phase photo-sensitizer into a solid film. By allowing the photo-resist layer to be heated without deteriorating material components, the soft-bake process enables the physical removal of an organic solvent and increases the adhesion ability of the photo-resist layer. Since the soft-bake process may have an effect on subsequent processes such as exposure and development, the overall region of the semiconductor substrate may be treated uniformly and precisely.

In step 203 (S203), an exposure process may be performed on the photo-resist layer using exposure equipment such as an ArF optical source having a wavelength of between approximately 191 nm to 195 nm.

As illustrated in example FIGS. 3 and 4A to 4C, when the soft-bake temperature is lowered to approximately 95 degrees C., the resulting PR pattern holes had poor circularity. As illustrated in example FIG. 4A, the inner profile of the PR pattern holes was poor. Also, even when the soft-bake temperature was raised to 105 degrees C., the resulting PR pattern holes also had poor circularity. As illustrated in example FIG. 4C, a top CD of the PR pattern holes was increased. In accordance with embodiments, it could be found that the circularity of PR pattern holes using the soft-bake temperature is optimized at a temperature of approximately 100 degrees C.

A first factor that may have an effect on the circularity of PR pattern holes is a numerical aperture (NA) of a lens that is a value in relation to the resolution of a PR pattern. The NA can be represented as D/2f, where "D" represents a lens diameter and "f" represents a focal length. In accordance with embodiments, the greater the NA and the larger the lens diameter may result in an enhancement of the circularity of contact holes.

As illustrated in example FIG. 5, in accordance with embodiments, the relationship between NA and a PR pattern hole diameter may show that the optimal NA value for obtaining enhanced circularity of PR pattern holes is approximately 0.78.

A second factor that may effect the circularity of PR pattern holes is sigma σ, which is a value related to the interference degree of light. In accordance with embodiments, several experiments were performed to regulate and derive the optimum σ. When a beam is transmitted through a PR layer forming a micro-pattern, the beam is transmitted through a photo-mask having a fine CD. In this case, there may occur a "diffraction phenomenon" that causes a beam to be transmitted through a photo-mask hole along an X-shaped path. Accordingly, it may be preferable to generate interference to offset light collected in the underside of a photo-mask such as a light-shielding layer, to which light is not necessary to attain, and to generate interference to reinforce the strength of light in a transmission layer to which a light arrives.

As illustrated in example FIG. 6, in accordance with embodiments, the relationship between σ and PR pattern hole diameter show that the greater the σ value, the resolution of holes may be increased to improve their circularity. In fact, the circularity of holes was found to deteriorate in proportional to an increase of the σ value. In was found that the optimum σ value for obtaining enhanced PR pattern hole circularity is approximately 0.50.

A third factor that may effect the circularity of PR pattern holes is a CD of a photo-mask used to form a PR pattern. Similarly, several experiments were performed to regulate and derive the optimum photo-mask CD. As illustrated in example FIG. 7, the relationship between a photo-mask CD and a PR pattern hole diameter show that when a minimum CD of photo-mask was approximately 140 nm, the upper portion of a hole was broken due to a high dosage, resulting in poor circularity. In which case, the minimum critical value of mask may be approximately 140 to 150 nm.

As illustrated in example FIG. 8A, when a photo-mask CD was approximately 160 nm, a PR pattern hole diameter was approximately 3.8 nm. As illustrated in example, this value may result in interference between neighboring holes. As illustrated in example FIG. 8C, in accordance with embodiments, the PR pattern hole diameter has an optimum value of approximately 2.8 nm when the photo-mask CD was approximately 145 nm. As illustrated in example FIG. 8D, in accordance with embodiments, the optimum diameter value of approximately 2.8 nm could minimize interference between neighboring PR pattern holes. Consequently, since an appropriate PR pattern hole diameter defined as a 3 sigma value is approximately 2.7 nm, it can be stated that the photo-mask CD of approximately 145 nm, which derives the hole diameter of approximately 2.8 nm, is an optimum process condition achieving an enhancement in the circularity of PR pattern holes.

In step 204 (S204), the resulting PR pattern holes may be subjected to a post exposure-bake (PEB) process in a temperature range of between 103 degrees C. to 107 degrees C. The PEB process may involve distributing an acid catalyst three-dimensionally in the photo-resist layer in order to obtain a latent image. An acid catalytic reaction may occurs using heat of approximately 100 degrees C., thereby causing a great change in the solubility of photo-resist regions of an exposed portion and a non-exposed portion. This may have an effect of achieving a significant improvement in photo-sensitivity. Accordingly, the PEB process is a process that may be conducted during chemical amplification PR. The establishment of appropriate PEB process conditions may be important in the utilization of far-ultraviolet micro-fabrication technology.

Illustrated in example FIG. 9 are PR pattern holes at temperatures of 100 degrees C., 105 degrees C., 110 degrees C., and 115 degrees C., respectively, and a graph illustrating the relationship between PEB process temperature and PR pattern hole diameter. Example FIGS. 10A to 10C illustrate PR pattern holes resulting from the PEB process at temperatures of 100 degrees C., 105 degrees C., 110 degrees C., and 115 degrees C.

As illustrated in example FIGS. 9 and 10A to 10C, the experimental results obtained by performing the PEB process at different temperatures show that, when the temperature was lowered to approximately 100 degrees C., the resulting PR pattern holes had poor circularity. As illustrated in example FIG. 10A, the PR pattern holes may also have a T-shaped upper portion. When the temperature was raised to approximately 110 degrees C., the resulting PR pattern holes also exhibited poor circularity. As illustrated in example FIG. 10C, there may also be a problem of forming a standing wave shaped profile in an inner wall of the resulting PR pattern hole. When the temperature was further raised to approximately 115 degrees C., a diamond profile may be formed in the inner wall of the PR pattern hole, which may result in severe deterioration in the circularity of PR pattern holes.

As illustrated in example FIG. 10B, in accordance with embodiments, it could be found that the circularity of PR pattern holes depending on the PEB process temperature may represent an optimum condition at a temperature range of between approximately 105 degrees C.

In step 205 (S205), a development process may be performed using a solvent to melt a specific PR region having relatively weak bonds due to the exposure process on PR pattern holes to which the PEB process is performed.

In step 206 (S206), a hard-bake process may be performed on the PR pattern holes by further removing the residual solvent to harden a polymer structure that is released during the development process.

As illustrated in example FIG. 11, PR pattern holes may be created at temperatures of 100 degrees C., 110 degrees C., and 120 degrees C., respectively. Example FIG. 11 further illustrates the relationship between a hard-bake temperature and PR pattern hole diameter. As illustrated in example FIGS. 12A to 12C, the PR pattern holes may be obtained using a hard bake process at temperatures of 100 degrees C., 110 degrees C., and 120 degrees C.

As illustrated in example FIGS. 11 and 12A to 12C, the experimental results obtained by performing a hard-bake process at different temperatures show that when the temperature was lowered to 100 degrees C. or raised to 120 degrees C., the resulting PR pattern holes had poor circularity. As illustrated in example FIGS. 12A to 12C, results measured via a scanning electron microscope show that there is no great change in the cross section of the PR depending on the hard-bake temperature. Therefore, it may be concluded that the circularity of PR pattern holes depending on the hard-bake process temperature represents an optimum condition at a temperature of approximately 110 degrees C.

In accordance with embodiments, the circularity of PR pattern holes can be improved by deriving optimum process conditions for bake temperature, NA value, σ value, and the minimum CD of photo-mask, which are factors having an effect on the optimization of a photography process. This may result in an improvement in the profile of contacts in an etching process after completion of a photographic process.

In accordance with embodiments, enhancing the profile of contacts holes may also contribute to enhancement of the operational reliability of a semiconductor device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    coating a photo-resist layer on a semiconductor substrate;
    performing a soft-bake process on the photo-resist layer;
    performing an exposure process on the photo-resist layer in order to form a plurality of photo-resist pattern holes;
    performing a post exposure-bake process on the photo-resist pattern holes;
    performing a development process on the photo-resist pattern holes; and
    performing a hard-bake process on the photo-resist pattern holes,
    wherein exposure equipment used during the exposure process utilizes a numerical aperture value of between approximately 0.7 to 0.85, a σ value range of between approximately 0.4 to 0.6, and a minimum critical value of mask range of between approximately 140 to 150 nm.

2. The method of claim 1, wherein the soft-bake process is performed at a temperature range of between approximately 98 degrees to 102 degrees C.

3. The method of claim 1, wherein during the exposure process, an optical source has a wavelength range of between approximately 191 nm to 195 nm.

4. The method of claim 1, wherein the post exposure-bake process is performed at a temperature range of between approximately 103 degrees C. to 107 degrees C.

5. The method of claim 1, wherein in the hard-bake process is performed at a temperature range of between approximately 108 degrees C. to 112 degrees C.

6. A method comprising:
    coating a photo-resist layer on a semiconductor substrate;
    performing a soft-bake process on the photo-resist layer at a temperature range of between approximately 98 degrees C. to 102 degrees C.;
    performing an exposure process on the photo-resist layer to form a plurality of photo-resist pattern holes, wherein the exposure process utilizes an ArF optical source having a wavelength of between approximately 191 nm to 195 nm;
    performing a post exposure-bake process on the photo-resist pattern holes at a temperature range of between 103 degrees C. to 107 degrees C.;
    performing a development process on the photo-resist pattern holes; and
    performing a hard-bake process on the photo-resist pattern holes at a temperature range of between approximately 108 degrees C. to 112 degrees C.,
    wherein exposure equipment used during the exposure process utilizes a numerical aperture value of between approximately 0.7 to 0.85, a σ value range of between approximately 0.4 to 0.6, and a mask minimum critical value range of between approximately 140 to 150 nm.

7. The method of claim 6, wherein the soft bake process is performed at a temperature of approximately 100 degrees C.

8. The method of claim 6, wherein the exposure-bake process is performed at a temperature of approximately 105 degrees C.

9. The method of claim 6, wherein the hard bake process is performed at a temperature of approximately 110 degrees C.

10. A method comprising:
    coating a photo-resist layer on a semiconductor substrate;
    performing a soft-bake process on the photo-resist layer at a temperature of approximately 100 degrees C.;
    performing an exposure process on the photo-resist layer to form a plurality of photo-resist pattern holes, wherein the exposure process utilizes an ArF optical source;
    performing a post exposure-bake process on the photo-resist pattern holes;
    performing a development process on the photo-resist pattern holes; and
    performing a hard-bake process on the photo-resist pattern holes at a temperature range of between approximately 108 degrees C. to 112 degrees C.,
    wherein exposure equipment used during the exposure process utilizes a numerical aperture value of between approximately 0.7 to 0.85, a σ value range of between approximately 0.4 to 0.6, and a mask minimum critical value range of between approximately 140 to 150 nm.

11. The method of claim 10, wherein the ArF optical source has a wavelength of between approximately 191 nm to 195 nm.

12. The method of claim 10, wherein the post exposure-bake process is performed at a temperature range of between 103 degrees C. to 107 degrees C.

13. The method of claim 10, wherein the post exposure-bake process is performed at a temperature of 105 degrees C.

14. The method of claim 10, wherein the soft bake process is performed at a temperature of approximately 100 degrees C.

15. The method of claim 10, wherein the hard-bake process is performed at a temperature range of between approximately 108 degrees C. to 112 degrees C.

16. The method of claim 10, wherein the hard-bake process is performed at a temperature of between approximately 110 degrees C.

\* \* \* \* \*